(12) United States Patent
Murai et al.

(10) Patent No.: US 10,907,773 B2
(45) Date of Patent: Feb. 2, 2021

(54) WAVELENGTH CONVERSION DEVICE AND LIGHT SOURCE DEVICE

(71) Applicants: KYOTO UNIVERSITY, Kyoto (JP); STANLEY ELECTRIC CO., LTD., Tokyo (JP)

(72) Inventors: Shunsuke Murai, Kyoto (JP); Yusuke Yokobayashi, Tokyo (JP); Yasuyuki Kawakami, Tokyo (JP); Keijiro Takashima, Tokyo (JP); Syousaku Kubo, Tokyo (JP); Yosuke Maemura, Tokyo (JP)

(73) Assignees: STANLEY ELECTRIC CO., LTD., Tokyo (JP); KYOTO UNIVERSITY, Kyoto (JP)

( * ) Notice: Subject to any disclaimer, the term of this patent is extended or adjusted under 35 U.S.C. 154(b) by 29 days.

(21) Appl. No.: 16/510,736

(22) Filed: Jul. 12, 2019

(65) Prior Publication Data
US 2020/0025341 A1    Jan. 23, 2020

(30) Foreign Application Priority Data
Jul. 17, 2018 (JP) .................................. 2018-134291

(51) Int. Cl.
*F21K 9/64* (2016.01)
*F21K 9/65* (2016.01)
*F21K 9/68* (2016.01)
*F21Y 115/30* (2016.01)

(52) U.S. Cl.
CPC .................. *F21K 9/64* (2016.08); *F21K 9/65* (2016.08); *F21K 9/68* (2016.08); *F21Y 2115/30* (2016.08)

(58) Field of Classification Search
CPC .. F21K 9/64; F21K 9/65; G02B 1/005; G02B 5/008; H01S 5/02
See application file for complete search history.

(56) References Cited

U.S. PATENT DOCUMENTS

| 6,236,033 B1 | 5/2001 | Ebbesen et al. |
| 2013/0258637 A1* | 10/2013 | Wang .................... H01L 33/505 362/84 |
| 2013/0294729 A1 | 11/2013 | Layton et al. |

(Continued)

FOREIGN PATENT DOCUMENTS

| EP | 1008870 A1 | 6/2000 |
| EP | 1672409 A1 | 6/2006 |

(Continued)

OTHER PUBLICATIONS

Extended European Search Report (EESR) dated Dec. 10, 2019 issued in European Application No. 19186700.1.

*Primary Examiner* — Joseph L Williams
*Assistant Examiner* — Jacob R Stern
(74) *Attorney, Agent, or Firm* — Holtz, Holtz & Volek PC (57) ABSTRACT

A wavelength conversion device includes: a wavelength conversion element having a phosphor plate that converts the wavelength of incident light upon a light incident surface to generate wavelength-converted light, and emits the wavelength-converted light from a light emission surface; an antenna array constituted of a plurality of optical antennas that are periodically arranged on the light emission surface of the phosphor plate; and a recessed structure including at least one recessed portion provided in the light emission surface of the phosphor plate.

12 Claims, 8 Drawing Sheets

(56) References Cited

U.S. PATENT DOCUMENTS

| | | | |
|---|---|---|---|
| 2015/0198303 A1 | 7/2015 | Park et al. | |
| 2015/0249183 A1 | 9/2015 | Hirasawa et al. | |
| 2016/0161644 A1* | 6/2016 | Verschuuren | H01S 5/005 250/396 R |
| 2017/0350563 A1* | 12/2017 | Lunz | F21K 9/64 |
| 2018/0024279 A1 | 1/2018 | Murai et al. | |

FOREIGN PATENT DOCUMENTS

| | | | |
|---|---|---|---|
| EP | 2894211 A1 | 7/2015 | |
| JP | 2018013688 A | 1/2018 | |
| WO | 2011156519 A2 | 12/2011 | |
| WO | WO-2012098487 A1 * | 7/2012 | H01L 33/502 |

\* cited by examiner

WAVELENGTH CONVERSION DEVICE AND LIGHT SOURCE DEVICE

BACKGROUND OF THE INVENTION

1. Field of the Invention

The present invention relates to a wavelength conversion device for converting the wavelength of light, and a light source device including the wavelength conversion device.

2. Background Art

Conventionally, light source devices that combine a light source that emits light of a predetermined wavelength (emission color) and a wavelength conversion device that converts the wavelength of the light from the light source and outputs the converted light are known. For example, Japanese Patent Application Laid-Open No. 2018-13688 discloses an illumination device that includes a light source, a wavelength conversion element, and an antenna array, as a light source device having improved directivity of emission light.

SUMMARY OF THE INVENTION

As described above, by arranging optical antennas into an array, the directivity of light emitted from a wavelength conversion element can be improved. However, the illumination device having the antenna array is susceptible to improvement in terms of reliable emission of the light whose wavelength is converted by the wavelength conversion element, with high directivity and high light extraction efficiency.

More specifically, for example, the antenna array is formed on a surface of a phosphor that constitutes the wavelength conversion element. Light that is emitted from a light source and incident upon the phosphor is provided with directivity by the action of the antennas, and is emitted to the outside as narrowed angle light.

However, a part of light existing inside the phosphor is absorbed in the phosphor, without being subjected to the action of the antennas. A part of light emitted from the phosphor, i.e., light having a relatively large emission angle from the phosphor is emitted in directions largely deviating from the emission direction of the other light having directivity.

As described above, out of light whose wavelength is converted in the wavelength conversion element, a part of the light is not subjected to the action of the antennas, and another part of the light is not extracted to the outside owing to its directivity. In order to emit light having high directivity with high extraction efficiency, it is preferable to minimize the generation of these parts of light.

Considering the above circumstances, the present invention aims at providing a wavelength conversion device having high directivity and high light extraction efficiency, and a light source device including the wavelength conversion device.

A wavelength conversion device according to the present invention includes: a wavelength conversion element having a phosphor plate configured to convert a wavelength of incident light upon a light incident surface to generate wavelength-converted light, and emit the wavelength-converted light from a light emission surface; an antenna array constituted of a plurality of optical antennas that are periodically arranged on the light emission surface of the phosphor plate; and a recessed structure including at least one recessed portion provided in the light emission surface of the phosphor plate.

A light source device according to the present invention includes: the wavelength conversion device; and a light source configured to generate light to be incident upon the phosphor plate.

DETAILED DESCRIPTION OF THE INVENTION

Embodiments of the present invention will be described below in detail.

First Embodiment

Figure 1:
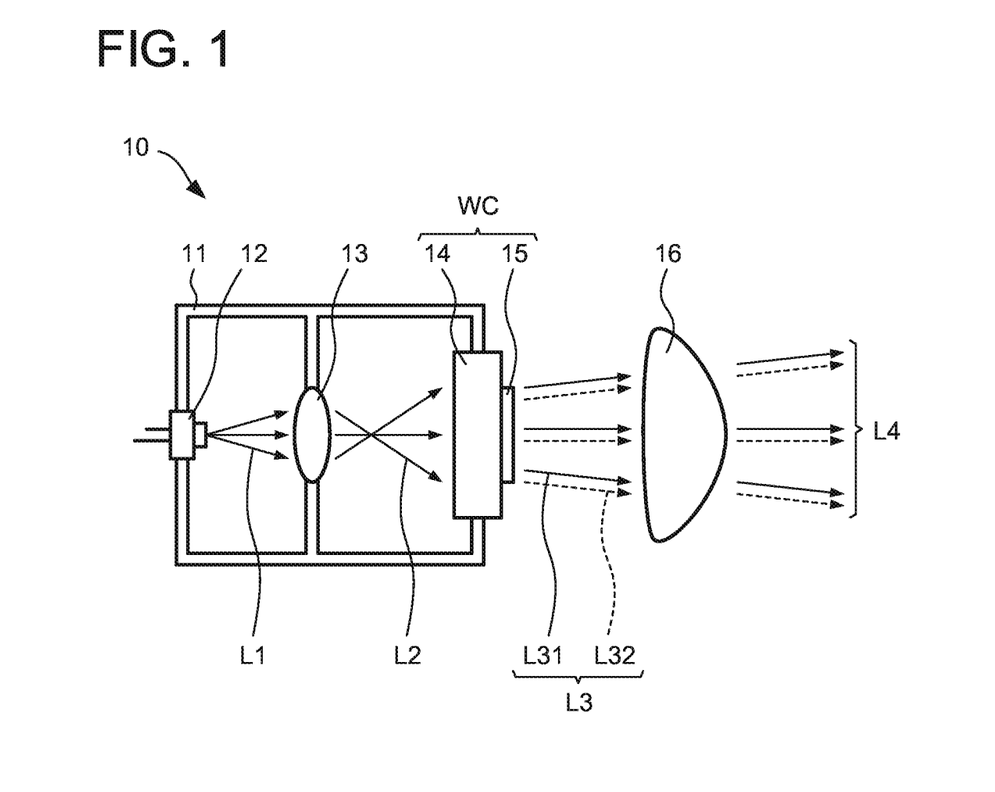
FIG. 1 is a diagram showing the structure of a light source device according to a first embodiment.

FIG. 1 is a diagram showing the structure of a light source device 10 according to a first embodiment. FIG. 1 is a schematic cross-sectional view of the light source device 10, though hatching is omitted therein. The light source device 10 includes a light source 12, a shaping optical system 13, a wavelength conversion element 14, and an antenna array 15 contained in a casing 11. The light source device 10 also includes a projection optical system 16 that projects light emitted from the wavelength conversion element 14 and the antenna array 15 to the outside. The light source device 10 can be used as, for example, a lighting device for vehicles and the like.

The light source 12 emits light of a predetermined wavelength range, as primary light L1. In the present embodiment, the light source 12 includes a laser element that generates a laser beam as the primary light L1, and is a laser source for emitting the laser beam. The light source 12 includes, for example, a semiconductor laser as the laser element. The light source 12 emits, for example, light having a peak wavelength in a range of 440 nm to 460 nm (hereinafter sometimes referred to as blue light) as the primary light L1. Note that the light source 12 is not limited to the laser source. For example, the light source 12 may be a light source including another light-emitting element such as a light-emitting diode.

The shaping optical system 13 shapes the primary light L1 into secondary light L2. For example, the shaping optical system 13 forms the beam shape of the laser beam, i.e., the primary light L1, and emits the formed laser beam as the secondary light L2. The shaping optical system 13 includes, for example, a condenser lens.

The wavelength conversion element 14 is disposed in the optical path of the secondary light L2 in the casing 11. The wavelength conversion element 14 converts the wavelength of the incident secondary light L2 to generate tertiary light L3 having a different wavelength from the secondary light L2. The tertiary light L3 includes wavelength-converted light L31 whose wavelength is converted by the wavelength conversion element 14, and transmitted light L32 corresponding to the secondary light L2 that has been transmitted through the wavelength conversion element 14 (in other words, the secondary light L2 whose wavelength is not converted). The wavelength conversion element 14 emits the wavelength-converted light L31 and the transmitted light L32 as the tertiary light L3.

The antenna array 15, which is formed on the wavelength conversion element 14, performs light distribution control of the tertiary light L3 emitted from the wavelength conversion element 14. In the present embodiment, the antenna array 15 performs light distribution control of mainly the wavelength-converted light L31 of the tertiary light L3. The antenna array 15 includes a plurality of periodically arranged fine optical antennas. The wavelength conversion element 14 and the antenna array 15 constitute a wavelength conversion device WC.

In the present embodiment, an opening for securely fitting the light source 12 and an opening for securely fitting the wavelength conversion element 14 are provided in the casing 11. The shaping optical system 13 is disposed between the light source 12 and the wavelength conversion element 14. In the present embodiment, the antenna array 15 is disposed on the surface of the wavelength conversion element 14 so as to face toward the outside of the casing 11.

Figure 2A:
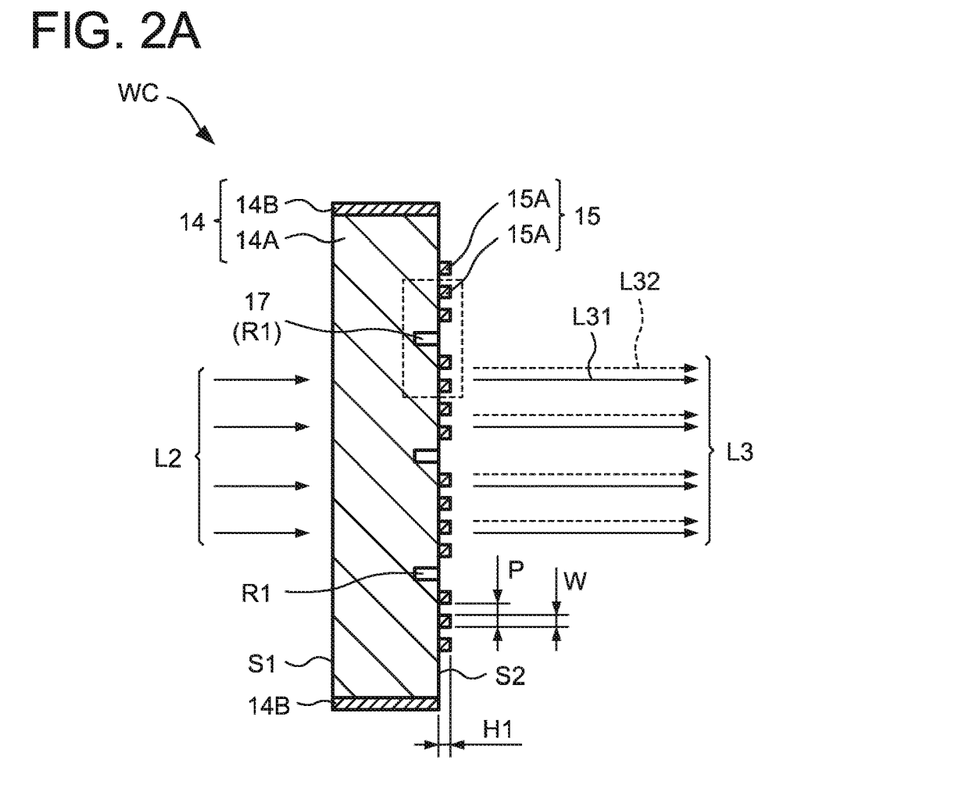
FIG. 2A is a cross-sectional view of a wavelength conversion element and an antenna array in the light source device according to the first embodiment.
Figure 2B:
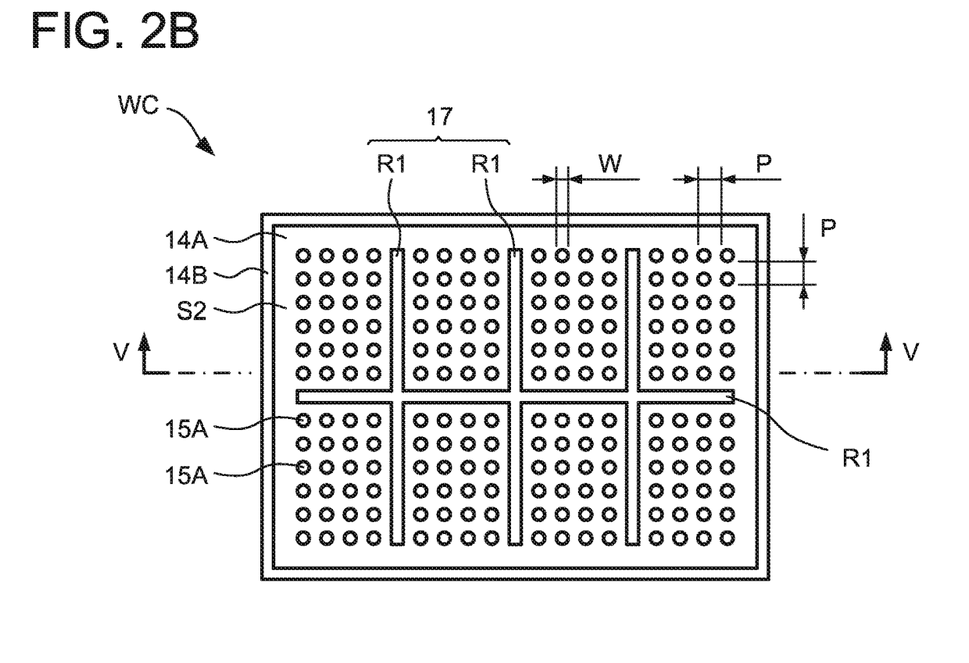
FIG. 2B is a top plan view of the wavelength conversion element and the antenna array in the light source device according to the first embodiment.

FIGS. 2A and 2B are a schematic cross-sectional view and a top plan view, respectively, of the wavelength conversion element 14 and the antenna array 15. FIG. 2B is a plan view that schematically shows the surface of the wavelength conversion element 14 on the side of the antenna array 15, and FIG. 2A is a cross-sectional view taken along the line V-V of FIG. 2B. The wavelength conversion element 14 and the antenna array 15 will be described with reference to FIGS. 2A and 2B.

The wavelength conversion element 14 includes a plate-shaped phosphor plate 14A containing a phosphor, and a light reflective film 14B formed on the sides of the phosphor plate 14A. In the present embodiment, one of main surfaces of the phosphor plate 14A functions as an incident surface (hereinafter referred to as light incident surface) S1 of the secondary light L2 of the wavelength conversion element 14. The other main surface of the phosphor plate 14A functions as an emission surface (hereinafter referred to as light emission surface) S2 of the tertiary light L3 of the wavelength conversion element 14. Note that, the antenna array 15 is formed on the light emission surface S2 of the phosphor plate 14A.

The phosphor plate 14A of the wavelength conversion element 14 receives the secondary light L2 at its light incident surface S1. The phosphor plate 14A converts the wavelength of the secondary light L2 therein, and generates the wavelength-converted light L31. The phosphor plate 14A transmits a part of the secondary light L2 as the transmitted light L32. The phosphor plate 14A emits the tertiary light L3, which includes the wavelength-converted light L31 and the transmitted light L32, from the light emission surface S2.

For example, the phosphor plate 14A is made of a single-phase ceramic plate into which a phosphor material is sintered. In the present embodiment, the phosphor plate 14A is made of a transparent ceramic plate into which a single-phase yttrium, aluminum, and garnet phosphor material having cerium as a luminescent center (YAG:Ce) is sintered.

When the phosphor plate 14A is made of a transparent ceramic plate made of a single-phase phosphor, the transmitted light L32 is emitted from the phosphor plate 14A, in the state of maintaining the light distribution characteristics of the incident secondary light L2 (the transmitted light L32 has the same traveling direction before and after the transmission through the phosphor plate 14A). Therefore, for example, when the laser beam from the light source 12 is incident upon the phosphor plate 14A as the secondary light L2, the transmitted light L32 has approximately the same light distribution characteristics as that of the laser beam.

Note that the phosphor plate 14A is not limited to being made of the ceramic plate. For example, the phosphor plate 14A may be made of a binder containing phosphor particles, molded into the shape of a board. For example, the phosphor plate 14A may be made of a transparent binder in which YAG:Ce phosphor powders are dispersed therein and fixed.

For example, the phosphor plate 14A of the wavelength conversion element 14 generates light (hereinafter sometimes referred to as yellow light) in a wavelength band of 500 nm to 800 nm as the wavelength-converted light L31. Therefore, in the present embodiment, a mixture of the yellow light (wavelength-converted light L31) and the blue light (transmitted light L32), which is recognized as white light, is outputted from the light emission surface S2 of the wavelength conversion element 14 as the tertiary light L3.

The light reflective film 14B reflects a part of the wavelength-converted light L31 and a part of the transmitted light L32 in the phosphor plate 14A to the light emission surface S2. This improves light extraction efficiency from the light emission surface S2 of the wavelength conversion element 14. The light reflective film 14B is made of, for example, a metal film, an optical multilayer film, a white resin film, or the like provided on the sides of the phosphor plate 14A. Note that the wavelength conversion element 14 does not necessarily have the light reflective film 14B.

Next, the antenna array 15 will be described. In the present embodiment, the antenna array 15 is formed on the light emission surface S2 of the wavelength conversion element 14, and has a plurality of optical antennas (hereinafter simply referred to as antennas) 15A arranged with a period (antenna period) P that is sufficiently larger than the optical wavelength of the transmitted light L32 (secondary light L2) in the phosphor plate 14A. In the present embodiment, the antennas 15A are arranged with the period P that corresponds to the wavelength of the wavelength-converted light L31 in the phosphor plate 14A.

In the present embodiment, each of the antennas 15A is a columnar, conical, or pyramidal metal projection. In the present embodiment, each of the antennas 15A has a columnar shape, and is made of a material having a plasma frequency in the visible region, such as Au (gold), Ag (silver), Cu (copper), Pt (platinum), Pd (palladium), Al (aluminum), or Ni (nickel), or an alloy or laminated body containing the material(s).

In the present embodiment, the antennas 15A have the same order of antenna heights H1 and antenna widths (diameters) W as each other. When the antenna 15A has a columnar, conical, or pyramidal shape, the antenna width W refers to the maximum width of the antennas 15A. For example, the antenna height H1 is 50 to 300 nm, and the antenna width W is 50 to 300 nm. In the present embodiment, the antennas 15A are arranged in a square lattice on the light emission surface S2 of the wavelength conversion element 14.

Next, the function of the antenna array 15 (hereinafter sometimes referred to as antenna function) will be described. When the wavelength-converted light L31 is applied to each antenna 15A of the antenna array 15, the strength of an electric field in the vicinity of the antennas 15A increases, owing to localized surface plasmon resonance at the surfaces of the antennas 15A. By setting the period P with which the antennas 15A are arranged on the order of the optical wavelength of the wavelength-converted light L31, the localized surface plasmon resonance of each of the adjoining antennas 15A cause resonance while generating optical diffraction, and the strength of the electric field in the vicinity of the antennas 15A further increases. Therefore, the light extraction efficiency of the wavelength-converted light L31 is improved.

As a result of the enhancement of the electric field, the wavelength-converted light L31 is amplified and emitted from the antenna array 15 with having narrow-angle light distribution characteristics (low etendue). In other words, the antenna array 15 has the functions of enhancing the wavelength-converted light L31 in the wavelength conversion element 14 and narrowing the emission direction of the wavelength-converted light L31, in addition to the function of improving the light extraction efficiency of the wavelength-converted light L31.

Note that the antenna array 15 produces the high antenna function by setting the antenna period P on the same order of or slightly larger than the wavelength of target light (wavelength in the medium). Accordingly, for example, when the phosphor plate 14A is made of a YAG:Ce phosphor, the wavelength-converted light L31 has a wavelength of 500 to 800 nm, and the phosphor plate 14A has a refractive index of approximately 1.82. Considering the obtainment of the high antenna function, the antenna period P is preferably set on the order of 300 nm to 500 nm.

On the other hand, the antennas 15A are arranged with the period P sufficiently larger than the optical wavelength of the transmitted light L32 (secondary light L2) in the phosphor plate 14A. Therefore, the antenna function is not applied to the transmitted light L32. In other words, the transmitted light L32 is emitted from the antenna array 15 in the state of maintaining the light distribution characteristics (strength and shape) of the secondary light L2 shaped by the shaping optical system 13. In the present embodiment, the wavelength of the secondary light L2 is 450 nm. Therefore, in the present embodiment, the antenna period P is, for example, 300 nm or more.

In other words, the antenna array 15 has the function of adjusting the strength and directivity of the wavelength-converted light L31 (for example, yellow light). On the other hand, the antenna array 15 passes the secondary light L2 (for example, blue light) whose wavelength is not converted in the phosphor plate 14A.

As described above, since the phosphor plate 14A is made of a transparent ceramic plate, and the antenna array 15 is configured to apply the antenna function to only the wavelength-converted light L31, the transmitted light L32 of the tertiary light L3 passes through the phosphor plate 14A and the antenna array 15. Therefore, by adjusting the directivity and output of the secondary light L2, which is light to be the transmitted light L32, such as by emitting a laser beam from the light source 12, both of the wavelength-converted light L31 and the transmitted light L32 can be produced with high directivity and output.

The present embodiment describes a case in which the antenna array 15 has the antenna period P that is sufficiently larger than the wavelength of the secondary light L2 (transmitted light L32) in the medium. However, the structure of the antenna array 15 is not limited thereto. For example, the antenna array 15 may have a plurality of antenna array segments having different antenna periods P from each other. The antenna array 15 may have any structure as long as the antenna array 15 has a plurality of antennas 15A that are periodically arranged on the light emission surface S2 of the phosphor plate 14A.

Next, as shown in FIGS. 2A and 2B, the wavelength conversion device WC has a recessed structure 17 including a plurality of recessed portions R1 that are formed in the light emission surface S2 (namely, the surface on which the antenna array 15 is provided) of the phosphor plate 14A of the wavelength conversion element 14. In the present embodiment, the recessed structure 17 includes a plurality of grooves extending in the arrangement directions of the antennas 15A of the antenna array 15 as the respective recessed portions R1.

In the present embodiment, the grooves as the recessed portions R1 are provided so as to partition an area, on which the antenna array 15 is formed, of the light emission surface S2 of the phosphor plate 14A. For example, in the light emission surface S2 of the phosphor plate 14A, the recessed structure 17 is disposed such that the antennas 15A of a predetermined number or more of periods (for example, 10 or more periods) are arranged between the adjacent recessed portions R1.

Figure 3:
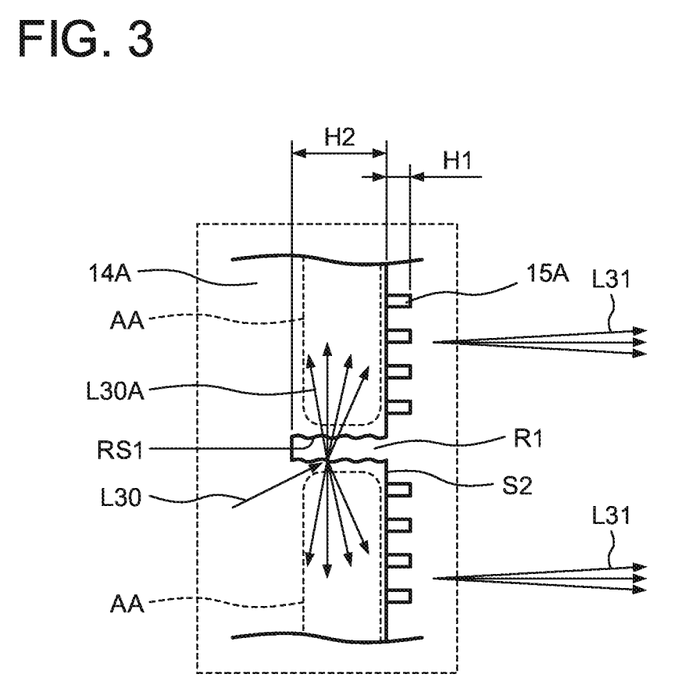
FIG. 3 is a schematic enlarged cross-sectional view of the wavelength conversion element and the antenna array in the light source device according to the first embodiment.

FIG. 3 is an enlarged cross-sectional view showing a portion enclosed by broken lines of FIG. 2A, with enlargement. In FIG. 3, hatching is omitted for the sake of clarity. The details and function of the recessed structure 17 will be described with reference to FIG. 3.

In the present embodiment, the recessed portion R1 of the recessed structure 17 is provided in the phosphor plate 14A as a groove having an approximately rectangular shape in cross section. In the present embodiment, the recessed portion R1 has side surfaces (sidewall surfaces) extending orthogonally to the light emission surface S2 and a bottom surface extending in parallel with the light emission surface S2. To form the recessed portion R1, for example, the phosphor plate 14A may be partly removed.

As shown in FIG. 3, in the present embodiment, the side surfaces RS1 of the recessed portion R1 have an uneven rough surface structure. In the present embodiment, the depth H2 of the recessed portion R1 is larger than the antenna height H1 of the antenna 15A. In the present embodiment, the recessed portion R1 has the depth H2 that is several times as much as the antenna height H1.

Next, the function of the recessed structure 17 will be described. The recessed structure 17 has the function of scattering light (hereinafter sometimes referred to as tertiary light before emission) L30 existing in the phosphor plate 14A, in other words, a part of the wavelength-converted light L31 before emission.

More specifically, a part of the tertiary light before emission L30 in the phosphor plate 14A reaches from the inside of the phosphor plate 14A to the side surface RS1 of the recessed portion R1. The side surface RS1 changes the propagation direction of the part of the tertiary light before emission L30. In the present embodiment, the part of the tertiary light before emission L30 is divided into a plurality of light beams as scattered light L30A, and a part of the scattered light L30A travels in approximately parallel directions with the light emission surface S2 of the phosphor plate 14A.

In other words, the recessed structure 17 keeps the tertiary light before emission L30 in an area in the vicinity of the light emission surface S2 inside the phosphor plate 14A. The recessed structure 17 propagates a part of the tertiary light before emission L30 in the parallel direction with the light emission surface S2 of the phosphor plate 14A, which is a direction producing the highest antenna effect. In the phosphor plate 14A, the tertiary light before emission L30 propagates in directions along the arrangement directions of the antennas 15A. The strength of the electric field thereby increases in the vicinity of the light emission surface S2 inside the phosphor plate 14A.

The scattered light L30A (the wavelength-converted light L31 that has become the scattered light L30A, in the present embodiment) is reliably subjected to the antenna function by the antenna array 15. More specifically, the antenna function of the antenna array 15 is produced most strongly in an area inside the phosphor plate 14A in the vicinity of the antennas 15A. In FIG. 3, areas AA (hereinafter sometimes referred to as antenna functional areas) in which the antenna function is produced strongly are indicated with broken lines. The depth of the antenna functional area AA from the light emission surface S2 is on the same order as the height H1 of the antenna 15A.

Light, such as the scattered light L30A, propagating along the arrangement directions of the antennas 15A in the vicinity of the antennas 15A is subjected to the high antenna function, and is kept for long time in the antenna functional areas AA. The scattered light L30A is reliably captured by the antennas 15A in the process of propagation.

Accordingly, the scattered light L30A is almost reliably subjected to the antenna function, and therefore is emitted from the wavelength conversion element 14 and the antenna array 15 with high light extraction efficiency, while the distribution angle thereof is reliably narrowed. Since the depth H2 of the recessed portion R1 is set larger than the antenna height H1, it is possible to increase light, such as the scattered light L30A, traveling in the directions of being kept for long time in the antenna functional areas AA. For example, when the antenna height H1 is in a range of 50 to 300 nm, the depth H2 of the recessed portion R1 may be at least 100 nm or more, and preferably 500 nm or more.

A light component of the scattered light L30A to be the transmitted light L32 becomes the wavelength-converted light L31 by conversion of its wavelength, or propagates inside the phosphor plate 14A without being subjected to the antenna function. The scattered light L30A that has become the wavelength-converted light L31 is emitted from the light emission surface S2, while being subjected to the antenna function. On the other hand, the scattered light L30A whose wavelength is still not converted is reflected from the light reflective film 14B or the light incident surface S1, and is then emitted from the light emission surface S2.

As described above, since the recessed structure 17 is provided in the vicinity of the antenna array 15, the distribution angle of the wavelength-converted light L31 generated inside the phosphor plate 14A is narrowed by being subjected to the antenna function, and therefore the wavelength-converted light L31 is emitted to the projection optical system 16.

In the present embodiment, the phosphor plate 14A is made of a transparent ceramic plate. Therefore, for example, by the use of a laser source as the light source 12, it is possible to easily uniform the strength ratio between the wavelength-converted light L31 and the transmitted light L32, while providing high directivity and high output to both the wavelength-converted light L31 and the transmitted light L32. Therefore, the light source device 10 that can obtain the tertiary light L3 having less color unevenness, high directivity, and high light extraction efficiency can be provided.

Besides the case of using the laser source as the light source 12, only by providing the predetermined light distribution characteristics to light (secondary light L2 in the present embodiment) incident upon the phosphor plate 14A of the wavelength conversion element 14, it is possible to easily provide a wavelength conversion structure that can emit the wavelength-converted light L31 and the transmitted light L32 having less color unevenness and high directivity.

In the present embodiment, the antennas 15A are arranged in a square lattice, and the recessed structure 17 has grooves, as recessed portions R1, extending in a lattice form along the arrangement directions of the antennas 15A. However, the structure of the antenna array 15 and the recessed structure 17 are not limited thereto.

For example, the antennas 15A may be arranged in a triangle lattice. The recessed structure 17 may not have grooves but have lands. The recessed portions R1 of the recessed structure 17 may be disposed in any positions as long as the recessed portions R1 are disposed in an area in which the antennas 15A are formed, of the light emission surface S2 of the phosphor plate 14A. The recessed structure 17 may have at least one recessed portion R1.

In the present embodiment, the recess portion R1 of the recessed structure 17 has a rectangular cross section, and has side surfaces RS1, which are rough unevenness surfaces. However, the structure of the recessed portion R1 is not limited thereto. For example, the interior wall surface of the recessed portion R1 may have the shape of a curved surface. In this case, for example, to generate the scattered light L30A with high efficiency, the recessed portion R1 may have a rough interior wall surface.

As described above, in the present embodiment, the wavelength conversion device WC includes the wavelength conversion element 14 including the phosphor plate 14A that generates the wavelength-converted light L31 by converting the wavelength of light (secondary light L2 in the present embodiment) incident from the light incident surface S1 and emits the wavelength-converted light L31 from the light emission surface S2, the antenna array 15 constituted of the plurality of antennas 15A that are periodically arranged on the light emission surface S2 of the phosphor plate 14A, and the recessed structure 17 including at least one recessed portion R1 provided in the light emission surface S2 of the phosphor plate 14A.

In the present embodiment, the light source device 10 includes the wavelength conversion device WC, and the light source 12 for emitting light (primary light L1, in the present embodiment) to be incident upon the light incident surface S1 of the phosphor plate 14A. The light source 12 is a laser source for generating a laser beam. Therefore, it is possible to provide the wavelength conversion device WC having high directivity and high light extraction efficiency, and the light source device 10.

Figure 4:
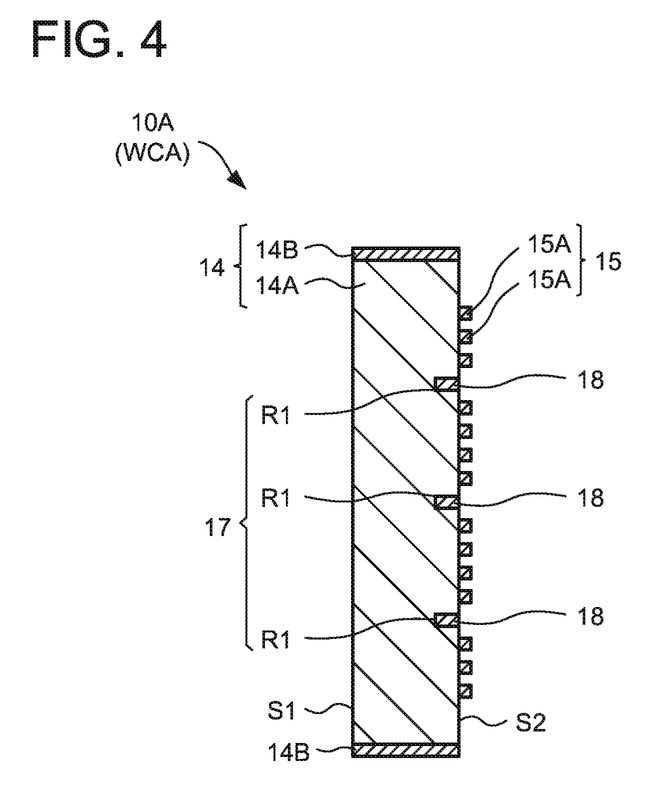
FIG. 4 is a cross-sectional view of a wavelength conversion element and an antenna array in a light source device according to a modified example of the first embodiment.

FIG. 4 is a cross-sectional view of a wavelength conversion device WCA of a light source device 10A according to a modified example of the first embodiment. The light source device 10A has the same structure as that of the light source device 10 except for the structure of the wavelength conversion device WCA. The wavelength conversion device WCA has the same structure as that of the wavelength conversion device WC except that light reflective portions 18 are provided in the recessed portions R1 of the recessed structure 17. In this modified example, the recessed portions R1 are filled with a resin material or a metal material as the light reflective portions 18. The light reflective portions 18 have reflectivity to the wavelength-converted light L31.

Since the wavelength conversion device WCA has the light reflective portions 18 in the recessed portions R1, light (tertiary light L3 before emission, in the present embodiment) incident upon the recessed structure 17 is diffused while being reflected. This increases the possibility that light (scattered light L30A, in the present embodiment) radiating from the recessed portions R1 proceeds to the antenna functional areas AA. Thus, a larger amount of light is subjected to the antenna function, and the wavelength-converted light L31 having a narrowed distribution angle can be obtained with high efficiency. Therefore, it is possible to provide the wavelength conversion device WCA having high directivity and high light extraction efficiency, and the light source device 10A.

Second Embodiment

Figure 5A:
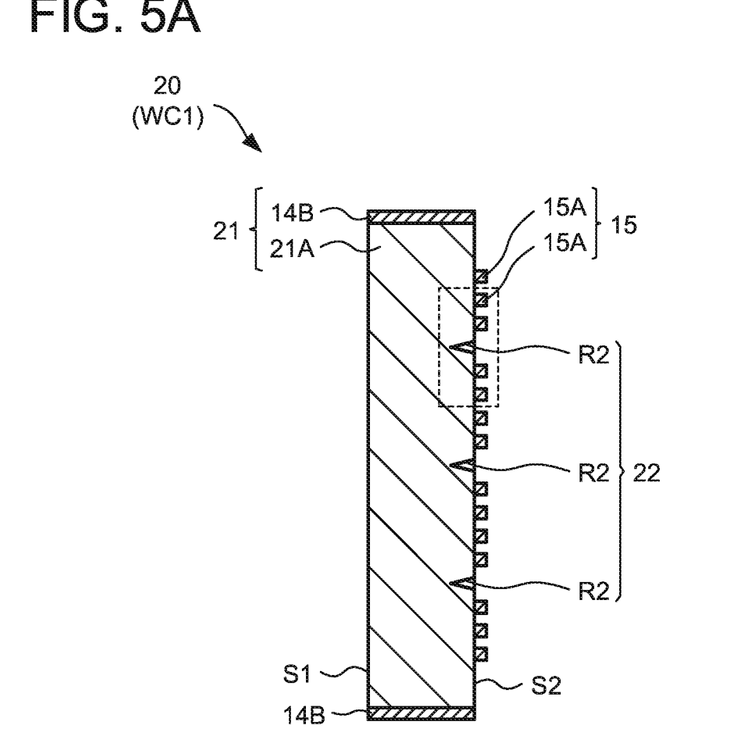
FIG. 5A is a cross-sectional view of a wavelength conversion element and an antenna array in a light source device according to a second embodiment.
Figure 5B:
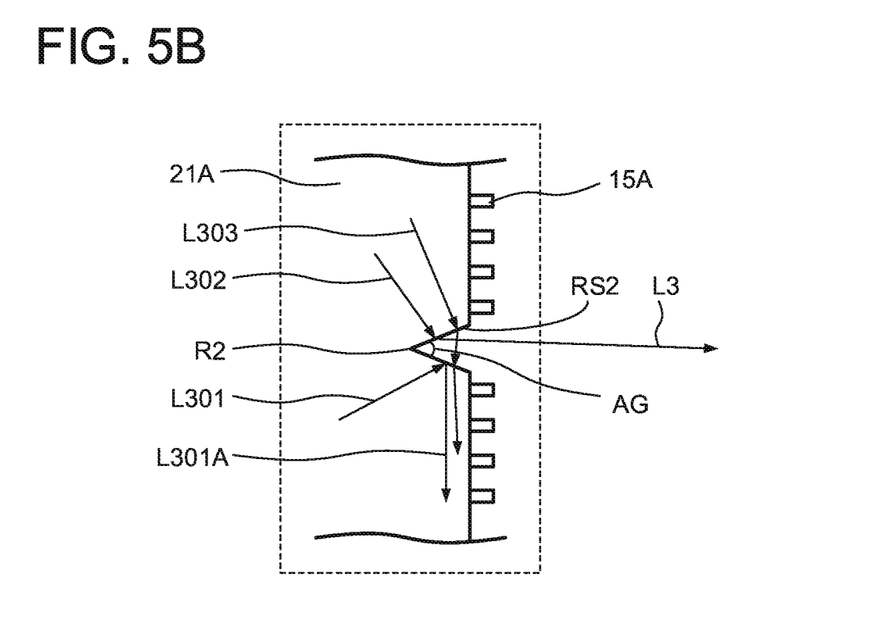
FIG. 5B is a schematic enlarged cross-sectional view of the wavelength conversion element and the antenna array in the light source device according to the second embodiment.

FIG. 5A is a cross-sectional view of a wavelength conversion device WC1 of a light source device 20 according to a second embodiment. FIG. 5B is an enlarged cross-sectional view showing a portion enclosed by broken lines of FIG. 5A, with enlargement. In FIG. 5B, hatching is omitted for the sake of clarity. The wavelength conversion device WC1 will be described with reference to FIGS. 5A and 5B.

The wavelength conversion device WC1 has the same structure as that of the wavelength conversion device WC except for the structure of a wavelength conversion element 21 and a recessed structure 22. In the wavelength conversion device WC1, the wavelength conversion element 21 has the same structure as that of the wavelength conversion element 14 except for having a phosphor plate 21A having grooves having a V-shaped cross section. The recessed structure 22 has the V-shaped grooves as recessed portions R2.

More specifically, the recessed portion R2 of the recessed structure 22 has side surfaces RS2 opposite each other, each of which is inclined with respect to the light emission surface S2 of the phosphor plate 21A. Note that, as in the case of the side surfaces RS1 of the recessed portions R1, the side surfaces RS2 extend in the arrangement directions of the antennas 15A. In other words, the recessed structure 22 has a plurality of V-shaped grooves as the recessed portions R2.

When the recessed portion R2 has the side surfaces RS2 that are inclined with respect to the light emission surface S2, a part of light incident upon the side surface RS2 is refracted and the refracted light is emitted from the side surface RS2. In other words, in the present embodiment, the recessed portion R2 has the function of increasing light that is subjected to the antenna function, in addition to the function of improving the light extraction efficiency from the phosphor plate 21A, just as with the recessed portion R1.

In the present embodiment, the side surface RS2 of the recessed portion R2 is preferably a flat surface. More specifically, as shown in FIG. 5B, light L301 that is incident upon the side surface RS2 of the recessed portion R2 at a critical angle or more, out of light existing in the phosphor plate 21A, is totally reflected from the flat side surface RS2. The propagation direction of a part of the reflected light L301A is changed to a direction along the arrangement direction of the antennas 15A (a direction approximately parallel with the light emission surface S2) in the phosphor plate 21A. Just as with the scattered light L30A according to the first embodiment, the reflected light L301A is subjected to the antenna function with high probability, and is emitted as tertiary light L3 (wavelength-converted light L31) having narrow-angle light distribution characteristics.

On the other hand, light L302 and L303 that is incident upon the side surface RS2 of the recessed portion R2 at angles less than the critical angle, out of the light existing in the phosphor plate 21A, is refracted at the side surface RS2 and extracted to the outside. The light L302 that is incident at an angle less than the critical angle is refracted to an illumination direction (also referred to as a normal direction of the light emission surface S2, or an optical axis direction or a narrow-angle direction of the tertiary light L3), and is emitted as tertiary light L3 having narrow-angle light distribution.

Furthermore, the light L303 that is incident upon the side surface RS2 at an angle less than the critical angle and is refracted at the side surface RS2 to a wide-angle direction (also referred to as a direction parallel with the light emission surface S2, or an arrangement direction of the antennas 15A) is emitted from the phosphor plate 21A, and then is incident upon the phosphor plate 21A again through the side surface RS2 opposite the side surface RS2 from which the light has been emitted. The propagation direction of the light L303 is changed to a direction approximately parallel with the arrangement direction of the antennas 15A. Just as with the scattered light L30A in the light source device 10 according to the first embodiment, the reflected light L303A is subjected to the antenna function with high probability, and is emitted as tertiary light L3 (wavelength-converted light L31) having narrow-angle light distribution characteristics.

In other words, the recessed portion R2 having the inclined side surfaces RS2 can emit light that is reflected or emitted from the side surfaces RS2, to the outside, while providing the light with the narrow-angle light distribution characteristics by refraction or the antenna function, as well as enhancing the antenna function and improving the light extraction efficiency.

To obtain both the increase in the antenna function and the improvement in the light extraction efficiency, an angle (vertical angle of the recessed portion R2, in the present embodiment) AG formed between the side surfaces RS2 of the recessed portion R2 is preferably 90 degrees or less. When a YAG:Ce single-phase phosphor is used in the phosphor plate 21A, setting the angle formed between the side surfaces RS2 of the recessed portion R2 at approximately 60 degrees enables light emitted in the normal direction of the side surface RS2 to be incident again upon the phosphor plate 21A, and light traveling approximately in parallel with the arrangement direction of the antennas 15A can be thereby increased. Therefore, the angle formed between the side surfaces RS2 of the recessed portion R2 is more preferably approximately 60 degrees. In the present embodiment, considering the refraction of the light L302 and the generation of the reflected light L301A with high efficiency, the side surface RS2 is preferably a flat surface.

The present embodiment describes a case in which the recessed portion R2 is formed as a V-shaped groove having two side surfaces RS2 each of which is inclined with respect to the light emission surface S2 of the phosphor plate 21A. However, the form of the recessed portion R2 is not limited thereto. For example, the recessed portion P2 may be a land-shaped conically concaved recessed portion. The recessed portion R2 may have any form as long as the recessed portion R2 has a side surface that is inclined with respect to the light emission surface S2 of the phosphor plate 21A.

Figure 6A:
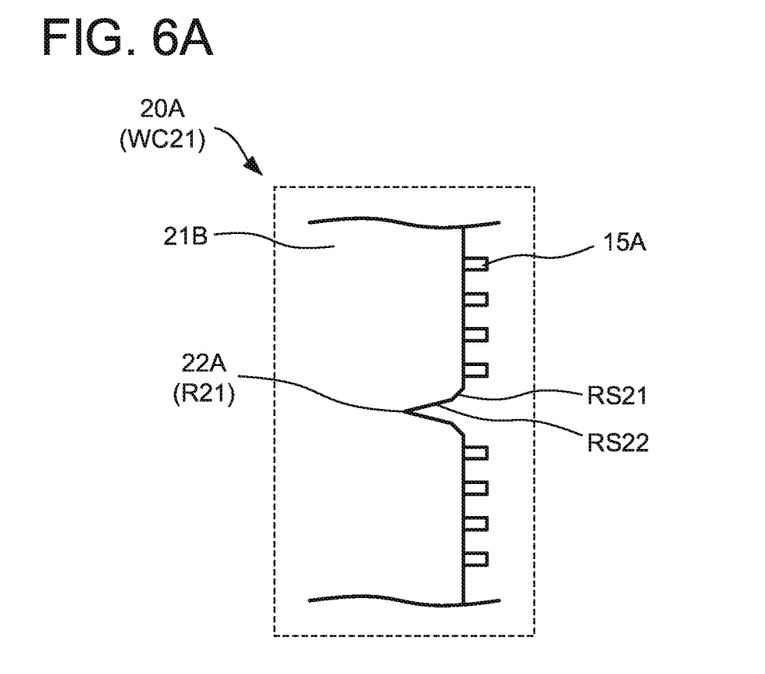
FIG. 6A is a schematic enlarged cross-sectional view of a wavelength conversion element and an antenna array in a light source device according to a first modified example of the second embodiment.

FIG. 6A is a cross-sectional view of a wavelength conversion device WC21 in a light source device 20A according to a first modified example of the second embodiment. In FIG. 6A, hatching is omitted for the sake of clarity. The wavelength conversion device WC21 has the same structure as that of the recessed structure 22 except for a recessed structure 22A (recessed portion R21) and a phosphor plate 21B. The recessed structure 22A has a plurality of side surfaces RS21 and RS22 that are inclined from a light emission surface S2 of the phosphor plate 21B at different angles from each other.

In the present embodiment, the recessed portion R21 has a side surface RS21 that is inclined from the light emission surface S2 of the phosphor plate 21B at a relatively small angle, and a side surface RS22 that is inclined from an end portion of the side surface RS21 at a side opposite the light emission surface S2 at a larger angle than the side surface RS21. The recessed portion R21 is a V-shaped recessed groove having two side surfaces RS21 and two side surface RS22. The recessed portion R21 is structured such that the two side surfaces RS22 are in contact with each other at its bottom.

As described above, the recessed portion R21 may have the side surfaces RS21 and RS22 that are inclined in two steps. In this case, to obtain both increase in the antenna function and improvement in the light extraction efficiency, an angle formed between the two side surfaces RS22 is preferably 90 degrees or less.

Figure 6B:
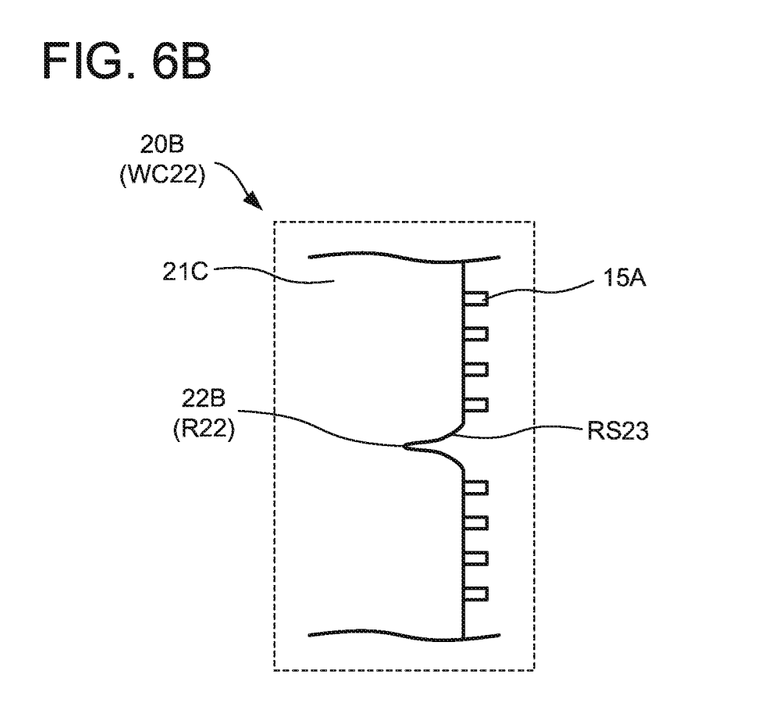
FIG. 6B is a schematic enlarged cross-sectional view of a wavelength conversion element and an antenna array in a light source device according to a second modified example of the second embodiment.

FIG. 6B is a cross-sectional view of a wavelength conversion device WC22 in a light source device 20B according to a second modified example of the second embodiment. In FIG. 6B, hatching is omitted for the sake of clarity. The wavelength conversion device WC22 has the same structure as that of the recessed structure 22 except for a recessed structure 22B (recessed portion R22) and a phosphor plate 21C. The recessed structure 22B has side surfaces RS23 that are each inclined from a light emission surface S2 of the phosphor plate 21C such that the inclination angle thereof varies continuously.

In the present modified example, the recessed portion R22 is a recess that is concave from the light emission surface S2 of the phosphor plate 21C while being bent continuously. The side surface RS23 of the recessed portion R22 has the form of a curved surface. As in the case of the recessed structure 22B, the recessed portion R22 may have the side surfaces RS23 having the form of the curved surfaces. Note that the side surfaces RS23 having the form of the curved surfaces provided in the recessed portion R22 enable the stable reflection or refraction of light incident from various directions upon the side surfaces RS23. Therefore, it is possible to stably increase light that is subjected to the antenna function, and improve light extraction efficiency.

As described above, in the present embodiment, the recessed structure 22 has recessed portions R2 each of which has the side surfaces inclined with respect to the light emission surface S2 of the phosphor plate 21A. Therefore, it is possible to provide the wavelength conversion device WC1 that has high directivity and high light extraction efficiency, and the light source device 20.

Third Embodiment

Figure 7:
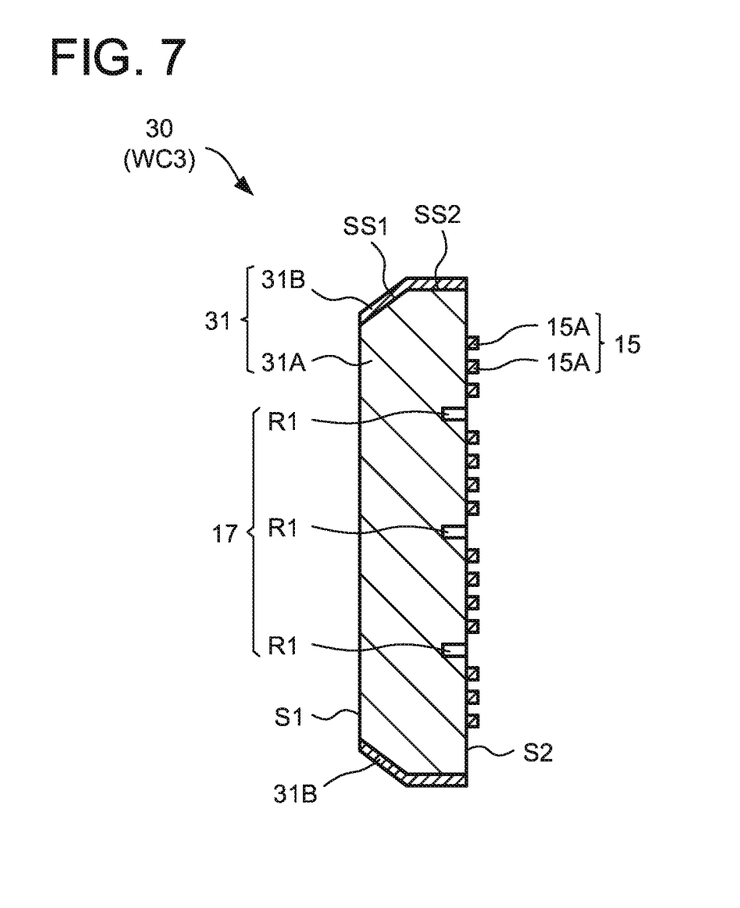
FIG. 7 is a cross-sectional view of a wavelength conversion element and an antenna array in a light source device according to a third embodiment.

FIG. 7 is a cross-sectional view of a wavelength conversion device WC3 in a light source device 30 according to a third embodiment. The wavelength conversion device WC3 has the same structure as that of the wavelength conversion device WC except for a phosphor plate 31A and light reflective films 31B. In the wavelength conversion device WC3, the phosphor plate 31A has side surfaces (inclined side surfaces) SS1 that are tapered from a light emission surface S2 toward a light incident surface S1.

In the present embodiment, the phosphor plate 31A includes side surfaces SS1 that inclinedly extend from the light incident surface S1 pyramidally toward the outside of the phosphor plate 31A, and side surfaces SS2 that extend from the side surfaces SS1 orthogonally to the light incident surface S1.

Since the phosphor plate 31A has the side surfaces SS1, a part of light that is present in the phosphor plate 31A and is repeatedly reflected between the side surfaces of the phosphor plate 31A and a part of light that returns toward the light incident surface S1 can be reflected to the light emission surface S2. Therefore, a chance to emit the light reflected from the side surfaces SS1 from the light emission surface S2 is increased. Therefore, light extraction efficiency from the phosphor plate 31A is improved.

In the present embodiment, in a wavelength conversion element 31, the light reflective film 31B is provided on both the side surfaces SS1 and SS2 of the phosphor plate 31A. This facilitates improving the light reflectivity of the side surfaces SS1 and SS2, and extracting a larger amount of light from the phosphor plate 31A. To reflect a larger amount of light to the light emission surface S2, the side surfaces SS1 are preferably provided on the side surfaces of the phosphor plate 31A in areas (for example, areas of side surfaces being in contact with the light incident surface S1) away from the light emission surface S2 (surface on which the recessed portions R1 are formed).

The present embodiment describes a case in which the phosphor plate 31A of the wavelength conversion element 31 has the side surfaces SS1 and SS2, and the light reflective film 31B is provided in each of the side surfaces SS1 and SS2. However, the structure of the wavelength conversion element 31 is not limited thereto. For example, the wavelength conversion element 31 may not have the side surfaces SS2. The phosphor plate 31A may have inclined side surfaces (pyramidically inclined side surface portions) that are tapered from the light incident surface S1 to the light emission surface S2. The light reflective films 31B may not be provided.

As described above, in the present embodiment, the phosphor plate 31A has the side surfaces SS1 that are inclined with respect to the light emission surface S2. Therefore, it is possible to provide the wavelength conversion device WC3 that has high directivity and high light extraction efficiency, and the light source device 30.

Fourth Embodiment

Figure 8:
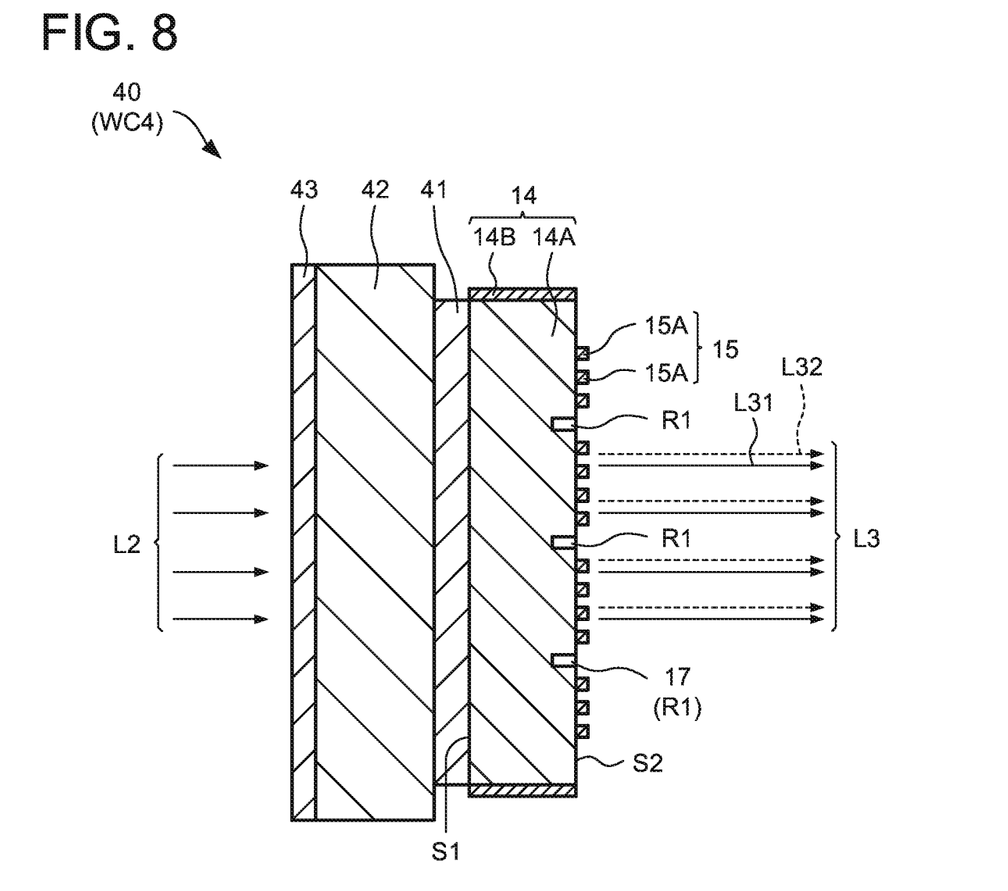
FIG. 8 is a cross-sectional view of a wavelength conversion element and an antenna array in a light source device according to a fourth embodiment.

FIG. 8 is a cross-sectional view of a wavelength conversion device WC4 in a light source device 40 according to a fourth embodiment. The wavelength conversion device WC4 includes a light reflective structure 41, a support 42, and an anti-reflective structure 43, in addition to a wavelength conversion element 14.

The wavelength conversion device WC4 includes the light reflective structure 41 having reflectivity to wavelength-converted light L31, provided on a light incident surface S1 of the wavelength conversion element 14, and the support 42 for supporting the wavelength conversion element 14 through the light reflective structure 41. The wavelength conversion device WC4 includes the anti-reflective structure 43 provided on the support 42 on the side of a light source 12.

The light reflective structure 41 has transparency to secondary light L2, while having reflectivity to the wavelength-converted light L31. For example, the light reflective structure 41 is made of a dichroic mirror provided on the light incident surface S1 of the phosphor plate 14A. When the light reflective structure 41 is made of the dichroic mirror, the light source 12 is preferably a laser source.

The support 42 is a substrate made of a material having transparency to the secondary light L2. For example, the support 42 is made of a transparent material having high thermal conductivity, such as, for example, $Al_2O_3$, $Ga_2O_3$, SiC, AlN, or GaN. The anti-reflective structure 43 is made of an anti-reflective film that transmits, for example, the secondary light L2 at high efficiency. Note that the anti-reflective structure 43 may be provided on the side of the light reflective structure 41 of the support 42.

In the wavelength conversion device WC4, the secondary light L2 passes through the anti-reflective structure 43, the support 42, and the light reflective structure 41, and then is incident upon the phosphor plate 14A of the wavelength conversion element 14. Out of the wavelength-converted light L31 generated in the phosphor plate 14A, light that has traveled to the light incident surface S1 proceeds to the light emission surface S2 owing to the light reflective structure 41. Heat generated in the wavelength conversion element 14 is emitted to the outside through the support 42. Therefore, the wavelength conversion device WC4 has high stiffness, high thermal dissipation, high operation stability, and long life.

As described above, the wavelength conversion device WC4 includes the light reflective structure 41 that is provided on the light incident surface S1 of the phosphor plate 14A and has reflectivity to the wavelength-converted light L31 and transparency to incident light upon the phosphor plate 14A, the support 42 for supporting the phosphor plate 14A through the light reflective structure 41, and the anti-reflective structure 43 provided on the support 42. Therefore, it is possible to provide the wavelength conversion device WC4 that has high operation stability and long life, in addition to high directivity and high light extraction efficiency, and the light source device 40.

This application is based on a Japanese Patent application No. 2018-134291 which is hereby incorporated by reference.

What is claimed is:

1. A light source device comprising:
a wavelength conversion element having a phosphor plate configured to convert a wavelength of incident light upon a light incident surface to generate wavelength-converted light, and emit the wavelength-converted light from a light emission surface;
an antenna array comprising a plurality of optical antennas that are periodically arranged on said light emission surface of said phosphor plate;
a recessed structure including at least one recessed portion provided in said light emission surface of said phosphor plate; and
a light source which generates light to be incident upon said light incident surface of said phosphor plate,
wherein said plurality of optical antennas are arranged with a period corresponding to a wavelength of the wavelength-converted light in said phosphor plate, and
wherein said at least one recessed portion comprises a groove arranged within the antenna array.

2. The light source device according to claim 1, wherein said at least one recessed portion has a rough interior wall surface.

3. The light source device according to claim 1, wherein a depth of said at least one recessed portion is larger than a height of said optical antennas.

4. The light source device according to claim 1, wherein said at least one recessed portion has a side surface that is inclined with respect to said light emission surface of said phosphor plate.

5. The light source device according to claim 1, wherein:
said optical antennas are arranged in a square lattice, and
said groove extends in a lattice form along arrangement directions of said optical antennas.

6. The light source device according to claim 1, wherein said phosphor plate has an inclined side surface that is tapered from said light emission surface toward said light incident surface.

7. The light source device according to claim 1, wherein said phosphor plate comprises a ceramic plate made of a single-phase phosphor.

8. The light source device according to claim 1, further comprising a light reflective portion provided in said at least one recessed portion of said recessed structure.

9. The light source device according to claim 1, wherein said wavelength conversion element has a light reflective film provided on a side surface of said phosphor plate.

10. The light source device according to claim 1, further comprising:
a light reflective structure provided on said light incident surface of said phosphor plate, the light reflective structure having transparency to the light incident from said light incident surface and reflectivity to the wavelength-converted light;
a support which supports said wavelength conversion element through said light reflective structure; and
an anti-reflective structure provided on said support on a surface opposite to said light reflective structure.

11. The light source device according to claim 1, wherein said light source is a laser source which generates a laser beam.

12. A wavelength conversion device comprising:
a wavelength conversion element having a phosphor plate configured to convert a wavelength of incident light upon a light incident surface to generate wavelength-converted light, and emit the wavelength-converted light from a light emission surface;
an antenna array comprising a plurality of optical antennas that are arranged in one direction with a predetermined pitch on said light emission surface of said phosphor plate; and
a recessed structure including at least one recessed portion provided in an area extending in a direction perpendicular to said one direction on said light emission surface of said phosphor plate, wherein said at least one recessed portion comprises a groove arranged within the antenna array.

* * * * *